United States Patent

Schmidt et al.

[11] Patent Number: 5,880,644
[45] Date of Patent: Mar. 9, 1999

[54] N-BIT PULSE WIDTH MODULATED SIGNAL GENERATOR

[75] Inventors: Thomas A. Schmidt; Andrew Marshall, both of Dallas, Tex.

[73] Assignee: Texas Instruments Incorporated, Dallas, Tex.

[21] Appl. No.: 963,781

[22] Filed: Nov. 4, 1997

[51] Int. Cl.$^6$ .................................................. H03K 7/08
[52] U.S. Cl. ............................................ 332/109; 375/238
[58] Field of Search ............................ 332/109; 375/238

[56] References Cited

U.S. PATENT DOCUMENTS 4,243,921  1/1981  Tamura et al. .......................... 331/1 A Primary Examiner—Sigfried H. Grimm
Attorney, Agent, or Firm—W. James Brady, III; Richard L. Donaldson

[57] ABSTRACT

A pulse width modulated signal generator is comprised of an N-bit ripple counter (12) that generates a down counted output value which is input to a combinatorial logic circuit for generating a pulse width that is defined as a predetermined number of clock cycles from a clock that is utilized to clock the ripple counter (12). The ripple counter (12) is cycled from a maximum value to a minimum value with the value "0000" inhibited. This count value is combined with a plurality of AND gates which also receive as an input an enable value from a input (18). When the ripple counter (12) is initiated at its maximum value, the output is pulled high and then a predetermined number of the clock pulses counted, as defined by the value of the enable word. Thereafter, the output is pulled low to define the length of the pulse.

16 Claims, 3 Drawing Sheets

N-BIT PULSE WIDTH MODULATED SIGNAL GENERATOR

TECHNICAL FIELD OF THE INVENTION

The present invention pertains in general to pulse width generators and, more particularly, to a pulse width generator that utilizes a ripple counter as the timing device for determining the width of the pulse.

BACKGROUND OF THE INVENTION

Pulse width modulators are typically utilized to generate a pulse of a predetermined width. To accurately define width of a pulse, a clocked system is typically utilized wherein the clock frequency is divided by some type of counter such that a predetermined number of clock pulses can be counted with the rising and falling edge of the pulse defined in some manner by the edge of the clock. Another method for defining this pulse width is to utilize some type of RC circuit wherein a timing capacitor will define a pulse width due to the length of time it takes for the charge from a capacitor to decay from a predetermined level to a lower second predetermined level through a resistor.

When a counter is utilized, this counter typically must be a synchronous counter. One problem that exists with utilizing a counter is that the designer must ensure that the output of the counter is decoded in such a manner that there are no "false" edges. This could result from two transitions occurring simultaneously on the input to the decode circuitry, such that the pulse is prematurely brought low, and the duration thereof is inaccurate. This is due to the fact that the synchronous system synchronizes all transitions to the main clock.

SUMMARY OF THE INVENTION

The present invention disclosed and claimed herein comprises a pulse width modulated signal generator for generating a pulse having a predetermined pulse width. The signal generator includes a clock generator for generating a clock signal to drive an N-bit ripple counter. The N-bit ripple counter is operable to provide on the output thereof a non-synchronous N-bit count output which is clocked by the clock signal. An enable word is provided having a value corresponding to the predetermined pulse width. This enable word and the N-bit count output of the N-bit ripple counter are then input to a combinatorial logic circuit, which combinatorial logic circuit is operable to determine the number of clock cycles required to generate the predetermined pulse width. When the count operation is completed by the combinatorial logic circuit, a reset signal is then generated. This reset signal is utilized by a control circuit, which control circuit initiates a pulse by changing an output from a first logic state to a second logic state, after which the initiation of the count operation by the combinatorial logic circuit is effected. When the reset signal is generated, the control circuit then changes the output from the second logic state to the first logic state.

In another aspect of the present invention, the N-bit ripple counter is operable to continually roll over at the end of the N-bit count operation, with the control circuit operable to initiate the pulse at least once during each count cycle. In the preferred embodiment, the count cycle is initiated at the beginning of the N-bit count, which N-bit count is a downward count.

In a further aspect of the present invention, an enable word circuit is provided for generating the enable word, which enable word is then incremented at least once for different cycles of the counter. Therefore, the pulse width can be varied in an incremental fashion for subsequent cycles of the counter. The pulse width can be varied from a value of 0% to a value of 100%. At the value of 100%, the output pulse width is continuously in the second logic state.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
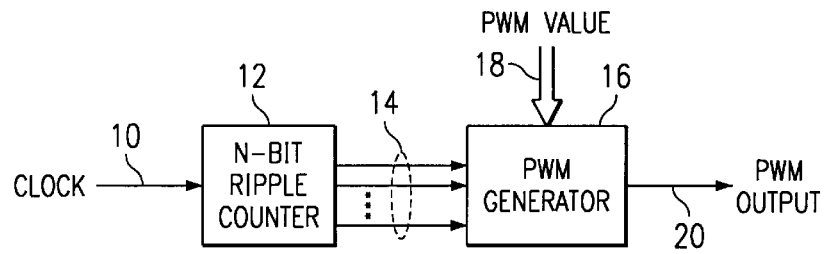
FIG. 1 illustrates an overall block diagram of the pulse width modulator of the present invention.

Referring now to FIG. 1, there is illustrated a block diagram of an N-bit pulse width modulator signal generator. A clock signal is received on a line 10 for input to an N-bit ripple counter 12. The N-bit ripple counter 12 provides an N-bit count output on lines 14 to a pulse width modulated generator 16. The pulse width modulated generator 16 receives an enable word input value on a bus 18 which defines the width of the pulse that is output by the pulse width modulated generator 16 on an output 20.

As will be described hereinbelow, the N-bit ripple counter 12 is generally comprised of flip/flops which are coupled together to generate the count output on lines 14. However, due to the use of flip/flops and the configuration thereof in a sequential manner, there will always be a delay from the transition on any one of the lines 14 as compared to any of the other transitions. This is due to the fact that a transition on the output of any one flip/flop will be the input for the next sequential flip/flop to cause the logic state on the output thereof to change. This therefore prevents a false logic state. The pulse width modulator 16 is comprised of combinatorial logic which receives and decodes the input lines 14 and the value on bus 18 to generate a pulse width of a defined length wherein the rising edge and falling edge of the pulse on the output 20 coincides with the edge of the clock 10.

Figure 2:
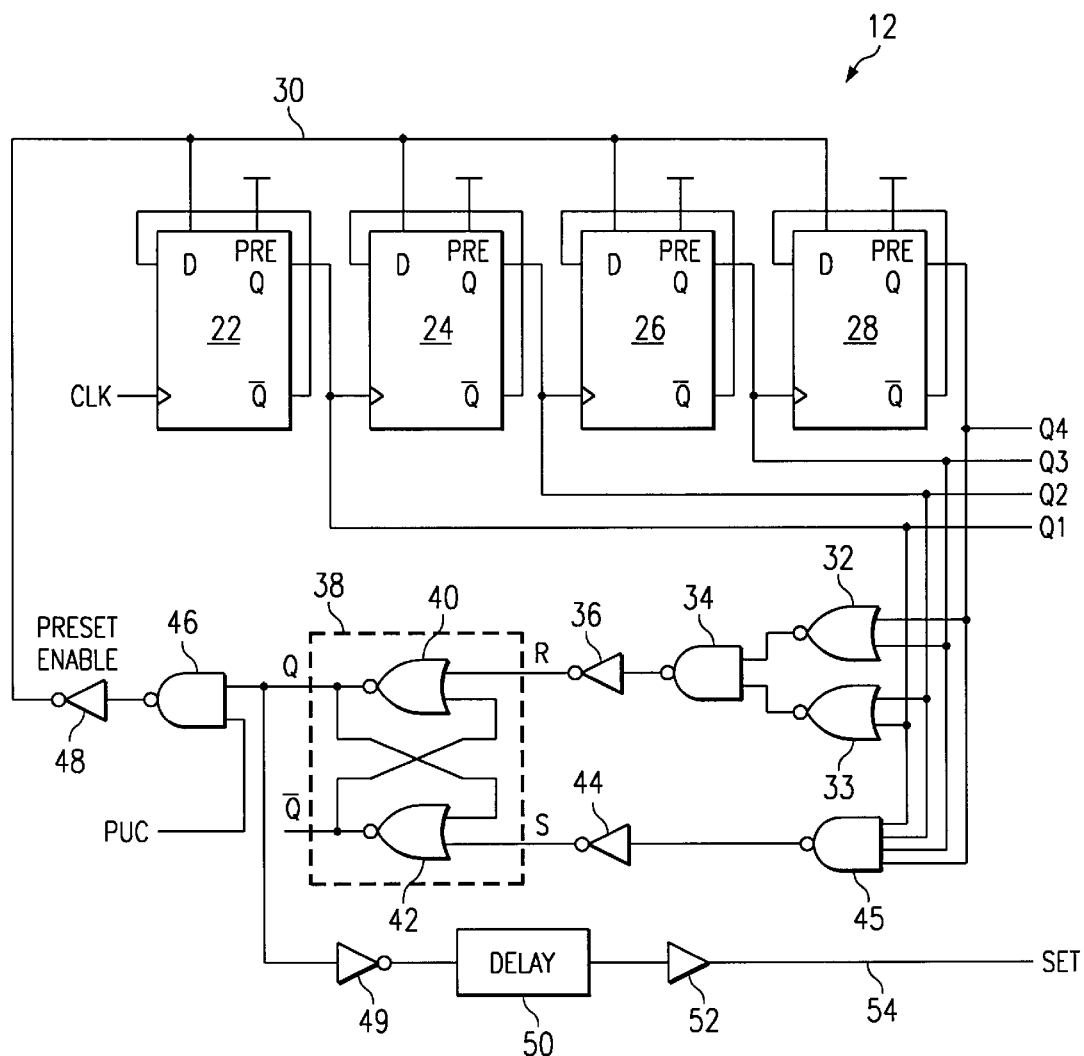
FIG. 2 illustrates a logic diagram of the N-bit ripple counter.

Referring now to FIG. 2, there is illustrated a logic diagram for the N-bit ripple counter 12. For illustrative purposes, only a 4-bit count output will be described, it being understood that any number of bits could be provided for. In the illustrated 4-bit ripple counter of FIG. 2, there are provided four D-type flip/flops 22, 24, 26 and 28. The flip/flop 22 is associated with the output Q1, the flip/flop 24 is associated with the output Q2, the flip/flop 26 is associated with the output Q3 and the flip/flop 28 is associated with the output Q4. Flip/flop 24 receives on the clock input thereof a master clock signal CLK. Each of the flip/flops 22–28 has the D-input thereof connected to the Q-Bar output. The Q-output of flip/flop 22 is connected to the clock input of flip/flop 24. Similarly, the Q-output of flip/flop 24 is connected to clock input of flip/flop 26 with the Q-output of flip/flop 26 connected to the clock input of flip/flop 28. This is a conventional ripple counter configuration. Depending upon the state that the counter is set to, it will count down from a given value in a binary manner.

The Preset Enable input of each of the flip/flops 22–28 is connected to a Preset Enable line 30. Each of the Preset inputs are connected to the supply voltage $V_{cc}$. Therefore, whenever the Preset Enable signal is set to the appropriate logic state, each of the flip/flops 22–28 will be set to a value of "1" on the Q-output thereof. On the next clock cycle, they will begin to count down. The purpose of this Preset will be described hereinbelow.

As will be described in more detail hereinbelow, it is desirable not to have the value of "0000" output by the ripple counter. When this occurs, the ripple counter will be immediately reset to a value of "1111". This is facilitated with combinatorial logic. This logic is facilitated with two NOR gates 32 and 33, NOR gate 32 having one input thereof connected to the Q4 output, and one input thereof connected to the Q3 output. Similarly, NOR gate 33 has one input thereof connected to the Q2 output and one input thereof connected to the Q1 output. The output of each of the NOR gates 32 and 33 is connected to a separate input of a 2-input NAND gate 34. The output of NAND gate 34 is connected through an inverter 36 to the Reset input of a NOR-configured set/reset latch 38. For the output of inverter 36 to go high, this will require the output of NAND gate 34 to go low. This will only occur when both inputs thereto are at a logic "high". This, of course, can occur only when the outputs of both of the NOR gates 32 are high, which requires all of the inputs to NOR gates 32 and 33 to be low. This will occur only when the value output by the ripple counter is "0000".

The set/reset latch 38 is comprised of two cross coupled NOR gates 40 and 42. One input of NOR gate 40 is connected to the Reset input on the output of inverter 36, the other input thereof connected to the output of NOR gate 42. One input of NOR gate 42 is connected to the Set input of the set/reset latch 38, the other input thereof is connected to the output of NOR gate 40. The output of NOR gate 40 is connected to the Q-output of the latch 38, with the output of NOR gate 42 providing the Q-Bar output.

The Set input of the latch 38 on the one input of the NOR gate 42 is connected to the output of an inverter 44, the input thereof connected to the output of a 4-input NAND gate 45. The four inputs of the NAND gate 45 are connected to the outputs Q1, Q2, Q3 and Q4, respectively. Therefore, when all of the outputs Q1, Q2, Q3 and Q4 of the ripple counter are at a logic "high" state, the output of inverter 44 will be at a logic "high", thus setting the latch 38.

The Q-output of the latch 38 on the output of NOR gate 40 is connected to one input of a 2-input NAND gate 46, the other input thereof connected to a power up signal PUC. The output of NAND gate 46 is connected through an inverter 48 to the Preset Enable line 30. As such, whenever the Q-output of latch 38 goes low for a Reset operation, then the Preset Enable signal will go low. The Set operation will occur whenever the Reset is at a logic "low", resulting in the Q-output going high.

A Set operation is provided by inputting the Q-output of latch 38 through an inverter 49 to a delay block 50, the output thereof input through a driver 52 to provide the output signal SET on a line 54. The operation of this SET signal will be described hereinbelow, it being noted that it will be a very short pulse with the length thereof defined by the delay 50. This is due to the fact that, when the Reset signal is generated due to the output of the ripple counter 12 being at a "0000" value, the ripple counter 12 will immediately be set to the value "1111". The length of time that the output is at a value "0000" is very short. The delay 50 ensures that the SET signal occurs after the ripple counter transition from "0000" to "1111" and also after the resulting reset signal.

Figure 3:
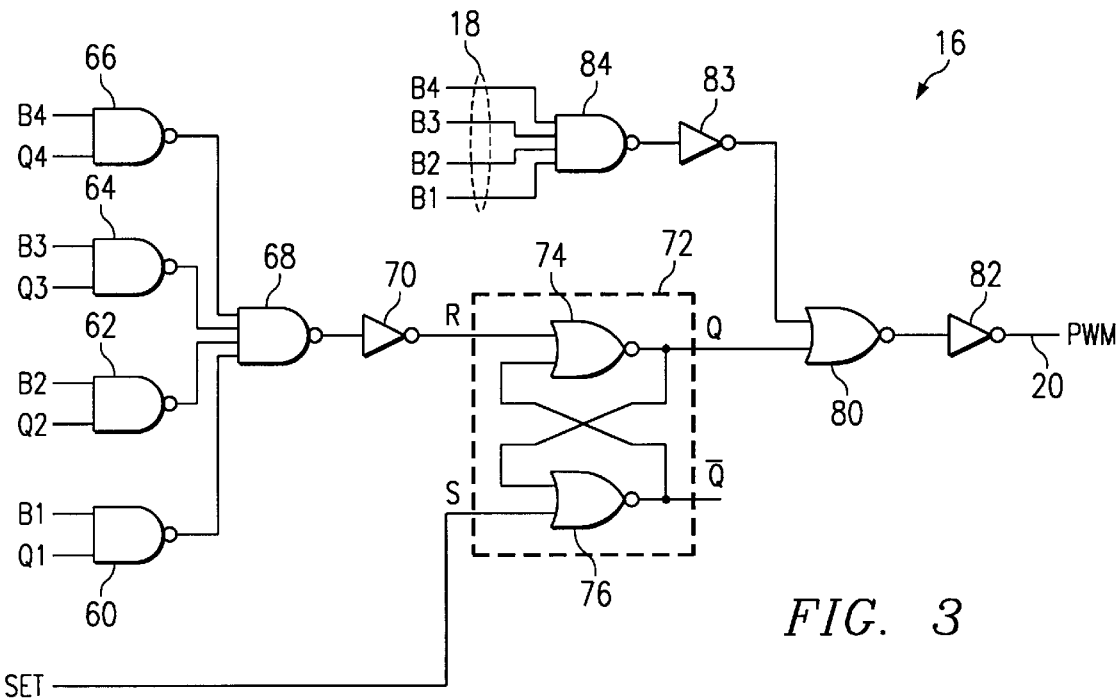
FIG. 3 illustrates a logic diagram of the pulse width modulator and decode circuit.

Referring now to FIG. 3, there is illustrated a logic diagram for the pulse width modulated generator 16. Four 2-input NAND gates, 60, 62, 64 and 66 are provided, one input of each of the NAND gates 62–66 connected to one of the outputs Q1, Q2, Q3 and Q4 with output Q1 connected to one input of NAND gate 60, output Q2 connected to one input of NAND gate 62, output Q3 input to one input of NAND gate 64 and output Q4 input to one input of NAND gate 66. The other inputs of the NAND gates 60–66 are connected to a separate bit on the bus 18, which is comprised of a 4-bit value with bits B1, B2, B3 and B4, B1 being the least significant bit.

The outputs of NAND gates 60–66 are each connected to a separate input of a 4-input NAND gate 68, the output thereof connected through an inverter 70 to the Reset input of a NOR configured cross coupled latch 72. It can be seen that the Reset input will go from a logic "low" to a logic "high" only when all of the inputs to the NAND gate 68 go high. Since each of the inputs is connected to the output of one of the NAND gates 60–66, the condition wherein all four outputs go high will occur only when either input to any of the NAND gates 60–66 is at a logic "low". Since, as described hereinabove, the ripple counter output is prevented from holding at a value "0000", then one of the inputs to the NAND gates 60–66 must be at a logic "high" state and the other at a logic "low" state.

The latch 72 is comprised of two cross coupled NOR gates 74 and 76, NOR gate 74 having one input thereof connected to the Reset input on the output of the inverter 70 and the output thereof connected to one input of NOR gate 76. The other input of NOR gate 74 is connected to the output of NOR gate 76 and the other input of NOR gate 76 is connected to the Set input of the latch 72. The output of NOR gate 74 provides the Q-output of latch 72 and the output of NOR gate 76 provides the Q-Bar output of latch 72.

In operation, the Set input is generated by the ripple counter 12 whenever the ripple counter counts down to the value "0000" and is immediately reset to a value of "1111". This will result in the Q-output of latch 72 going high, depending upon the state of the Reset input, as will be described hereinbelow. Thereafter, when a state exists wherein either input for each of the NAND gates 60–66 is at zero, then the Reset input to latch 72 will be driven high, toggling the latch and causing the Q-output thereof to go low. The time between the Set operation and the Reset operation will define the pulse width.

The Q-output of latch 72 is input to one input of a NOR gate 80, the output thereof input through an inverter 82 to provide the pulse width modulated output on output 20. The other input of NOR gate 80 is connected to the output of an inverter 83, the input thereof connected to the output of a 4-input NAND gate 84. The four inputs of the NAND gate 84 are connected to the four bits of the bus 18, B1, B2, B3 and B4. Whenever the values of B1, B2, B3 and B4 are high, this will force the output of inverter 83 to a logic "high" and, subsequently, the output 20 will be forced high independent of the operation of the latch 72. As will be described hereinbelow, this is for the purpose of insuring that a value of "1111" on the bus 18 will result in a 100% pulse width for each cycle of the ripple counter 12.

In this example, the ripple counter is configured to be a divide-by-fifteen counter. In the general case, the ripple counter is configured to be a divide-by-($2^n$-1) counter, where n is the number of ripple counter stages. The SET signal is a one shot signal that occurs once every fifteen cycles of the CLK signal. The pulse width modulator is operable to AND the output of the ripple counter 12 with the enable word on the bus 18. This enable word defines the number of clock cycles between the Set input and the generation of the Reset signal. In this way, the ON time of the PWM signal is a multiple of the CLK signal dependent on the value stored in the enable word. If the enable word has a value of "0000", this will result in a logic "0" on the input of each of the NAND gates 60–66 and will hold the Reset input to the latch 72 low, such that the output on line 20 will stay at a logic "low". The period is determined by the SET signal. Since the enable word can range from a value "0000" to "1111", or from 0–15, the output duty cycle can range from 100% in steps of 1/15.

Referring further to FIG. 3, it can be seen that the NAND gates 60–66 operate as gates which allow the clock signals Q1, Q2, Q3 and Q4 to be passed through to the NAND gate 68. Therefore, the enable word is operable to determine which of the clock signals are passed through to the NAND gate 68, thus providing a NOR function. Therefore, if any of the bits of the enable word are a logic "low, this will effectively place the output of the associated one of the NAND gates 60–66 always high, such that it will not have any effect on the reset operation of the latch 72. Therefore, these bits can be viewed as "activators" for the associated clock signal. It is then only necessary to determine when the logic states of the "activated" clock signals are all at a logic low. At this time, the reset signal will transition high. It is important to note that, with the use of a non-synchronous ripple counter, the logic state of the lowest order bit will always change before the logic state of the highest order bit, due to the inherent delay in the ripple counter. Also, the latch 72 provides that the pulse will be pulled low only once during the cycle or until the SET signal is again generated. This results in the minimum amount of circuitry and therefore silicon die area to achieve the desired result.

Figure 4:
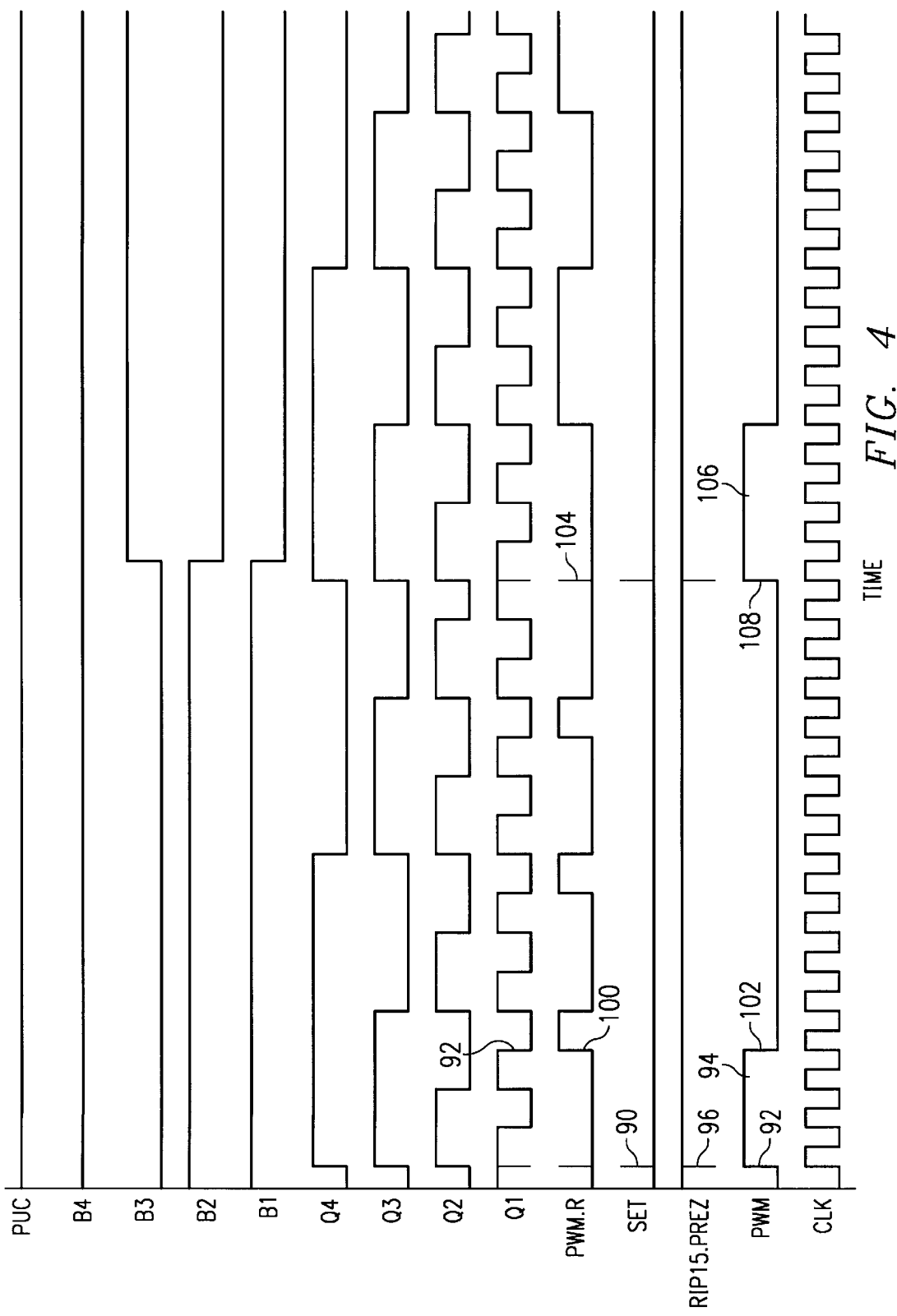
FIG. 4 illustrates a timing diagram depicting the operation of the pulse width modulator of the present invention.

Referring now to FIG. 4, there is illustrated a timing diagram depicting the overall operation of the system, with there being two values for the enable word. The first value is "1100" and the second value is "0010". This is illustrated as a clocked function, although any type of input could be utilized. Upon generation of the SET signal at a pulse 90, the output of latch 72 will go high and the output 20 will go high, as indicated by an edge 92, a pulse 94 comprising the output. This Set pulse 90 also coincides with a Preset Enable pulse 96, which is input to each of the flip/flops 22–28 on line 30, as described hereinabove.

Once the pulse 94 is at a high logic state, the next rising edge of the clock will cause the output Q1 to go low, thus initiating a down count sequence. The count sequence will continue and, when the edge 98 on the output signal Q1 occurs after three clock cycles, at which time the output Q2 is low, a value "0011" will result on the ripple counter output which is the exact opposite in bit logic states to the value "1100" for the enable input word. This will cause the Reset input to latch 72 to go high at an edge 100 for a single clock cycle. When the Reset goes high at edge 100, this will cause the pulse 94 to go low at an edge 102. It will remain here until another Set pulse is generated, indicated by a pulse 104.

It is important to note that the ripple counter takes advantage of the fact that the transition of higher order outputs is always preceded by changes on lower order flip/flops. It can be seen that changes on the flip/flop outputs, Q4, Q3, Q2 and Q1 are always delayed from the previous flip/flop. The output Q4 will always change states after Q3, Q2 and Q1, with Q3 changing states after Q2 and Q1, and Q2 changing states after Q1. In this manner, the highest order enabled bit always transitions from a high to a low after the lower order bits. This is very important when utilizing an OR function with these enabled bits OR'ed together because false switches due to simultaneous transitions on the added signals is avoided.

As illustrated in FIG. 4, there is also a second cycle that is initiated at the Set pulse 104, wherein a PWM pulse 106 goes high at an edge 108 and the enable word value is changed to "0010". As such, the ripple counter output will need to reach a value of "1101" to reset the pulse 106. This will require four clock pulses as compared to the previous cycle which only required three clock pulses. Therefore, it can be seen that the output pulse will be generated every fifteen clock cycles with the width of the pulse dependent upon the value of the enable word.

Figure 5:
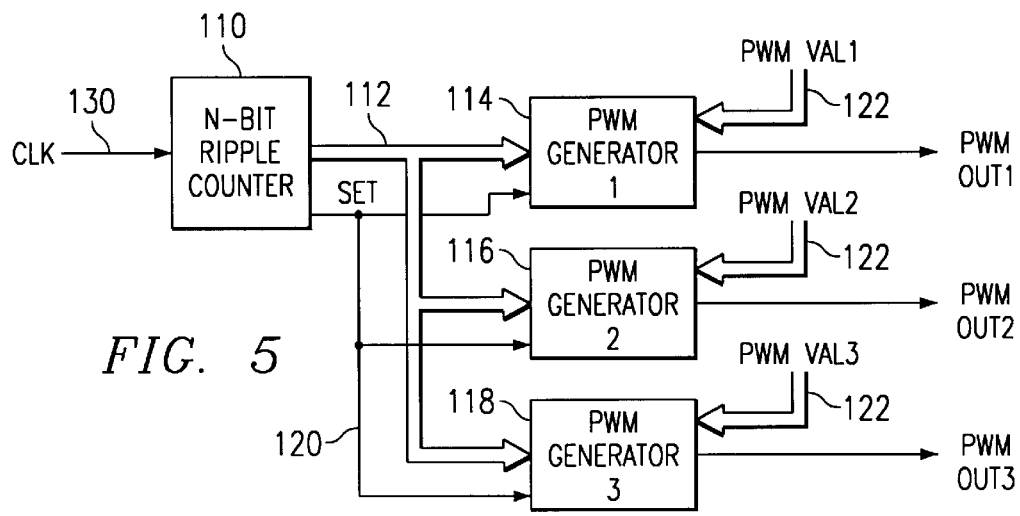
FIG. 5 illustrates a block diagram of one application of the N-bit ripple counter for driving a plurality of pulse width modulated generators.

Referring now to FIG. 5, there is illustrated an application of the present invention wherein a plurality of PWM generators are associated with a single N-bit ripple counter 110. The N-bit ripple counter 110 is identical to the N-bit ripple counter 12 and is operable to output the count value on a bus 112, the bus 112 being an N-bit bus. This bus 112 is input to three PWM generators 114, 116 and 118, each being identical to the PWM generator 16. The SET signal on a line 120 is also output by the N-bit ripple counter 110 to each of the PWM generators 114–118. Each of the PWM generators 114–118 is operable to receive a PWM value on an input 122, each capable of being different. As such, the pulse width output by each of the PWM generators 114–118 can be different, they being independent of each other. The only exception is that they are referenced to the same clock signal on an input 130 to the N-bit ripple counter 110, such that the leading edge of the pulse output by each of the PWM generators 114–118 will be synchronized. The only exception is that the number of clock pulses that are counted before the falling edge of the output pulse occurs will be dependent upon the input PWM value on input 122 to each of the PWM generators 114–118. The configuration of FIG. 5 allows a single counter 110 to be utilized to provide pulses of varying widths.

Figure 6:
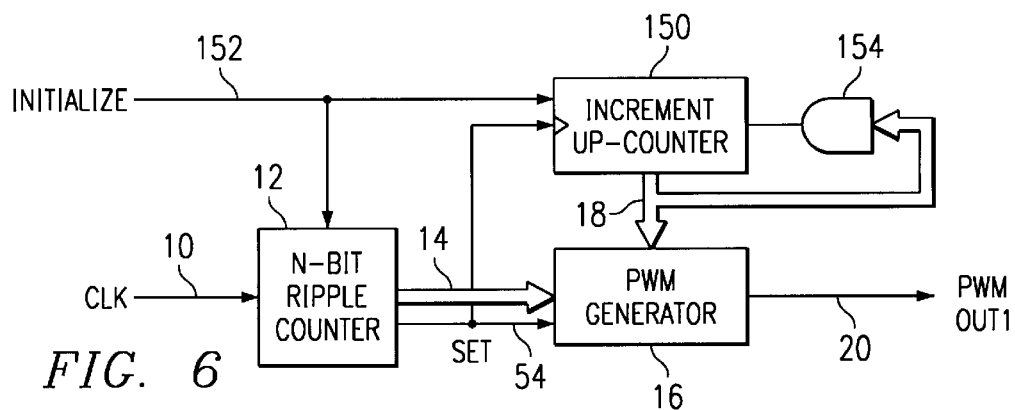
FIG. 6 illustrates a block diagram of one application of the signal generator of FIG. 1.

Referring now to FIG. 6, there is illustrated a block diagram of one application of the signal generator described hereinabove with reference to FIG. 1. As noted above, the PWM generator is operable to generate a pulse every fifteen clock cycles and then repeat the pulse. The width of the pulse is dependent upon the input value on the input 18. In one application of the signal generator, it is desirable to perform a controlled turn-on operation for a switch mode regulator or other design where it is advantageous to ramp the duty cycle slowly from zero to some steady-state value. In order to do this, an incremented up counter 150 is provided to generate the enable word on the bus 18 for input to the PWM generator 16. When the system is initialized via signal on a line 152, this corresponding to the PUC input to NAND gate 46 in FIG. 2, then the ripple counter 12 will initiate at a count value "1111" and the up counter 150 will initiate at a value "0000". Thereafter, the SET signal on line 54 will be input to the clock input of the up counter 150. If all bits of the up counter 150 are utilized for input to the enable signal input of the PWM generator 16, then the counter 150 will be incremented for each cycle of the ripple counter, i.e., each fifteen clocks. However, it is possible to select upper bits on the output of the counter 150, such that select ones of the least significant bits are not a portion of the word. In this manner, the pulse width on the output of the PWM generator 16 will remain the same length for a predetermined number of clock cycles of the counter 150, the clock cycles determined by the occurrence of the SET signal. However, as soon as the enable word is incremented in value, the pulse width will increase until the next increment of the enable word. This increasing function will continue until the input enable value is "1111". At this point, the up counter 150 is interrupted, this being facilitated by a logic circuit such as an AND gate 154 having sufficient inputs to interface with all bits of the enable bus 18 and a single output input to the counter 150. Internal to the counter 150, all that is required is a gate on the clock input that will prevent the SET signal on line 54 from clocking the counter. This structure will be reset upon another initialized operation. As such, this will then provide a pulse width that varies from zero percent to one hundred percent primarily as a function of the enable word value.

In summary, there has been provided a pulse width modulated signal generator that utilizes a ripple counter as the timing device. The ripple counter provides a non-synchronous clock output, wherein a state change in any one of the outputs will be such that a lower order bit will change before a higher order bit changes. This count value is then combined with an enable word with combinatorial logic to count a predetermined number of clock pulses that are utilized to clock the ripple counter to define the width of a pulse. This will occur once for every cycle of the ripple counter.

Although the preferred embodiment has been described in detail, it should be understood that various changes, substitutions and alterations can be made therein without departing from the spirit and scope of the invention as defined by the appended claims.

What is claimed is:

1. A pulse width modulated signal generator for generating a pulse having a predetermined pulse width, comprising:
    a clock signal;
    an N-bit ripple counter for providing a non-synchronous N-bit count output and clocked by said clock signal;
    an N-bit enable word having a value corresponding to the predetermined pulse width with N enable bits;
    a combinatorial logic circuit for receiving the N clock outputs of said ripple counter and the N enable bits of said enable word, said combinatorial logic circuit for determining the number of clock cycles required to generate said predetermined pulse width, as defined by said enable word, and generate a reset signal after said determined number of clock cycles has occurred; and
    a control circuit for initializing a pulse by changing an output from a first logic state to a second logic state and initiating the operation of said combinatorial logic circuit to determine the number of clock cycles required to generate said predetermined pulse width and then changing from said second logic state to said first logic state on said output when said reset signal is generated, wherein the clock transitions on the N clock outputs are delayed from each other as a result of the inherent operation of said ripple counter with the transitions of the lower order N clock outputs occurring before the transitions of any of the higher order N clock outputs relative thereto, such that no false transitions from said second logic state to said first logic state occur prior to the determined number of clock cycles having occurred from initiation of the pulse.

2. The signal generator of claim 1, wherein said N-bit ripple counter continually rolls over at the end of said count operation provided thereby and wherein said control circuit is operable to initiate said pulse at least once during each count cycle of said ripple counter.

3. The signal generator of claim 2, wherein said control circuit is operable to initiate said pulse at the time said ripple counter rolls over.

4. The pulse generator of claim 2, and further comprising an enable word circuit for generating said enable word and incrementing said enable word at least once for different cycles of said counter.

5. The signal generator of claim 4, wherein said enable word circuit is operable to continually increment the value of said enable word from a first value to a second value over different cycles of said ripple counter.

6. The signal generator of claim 5, wherein said enable word generator is operable to increment said enable word from a "0" value to a maximum value.

7. The signal generator of claim 6, wherein said enable word generator is operable to increment said enable word to said maximum value such that said maximum value results in the pulse width being the length of said count cycle in said ripple counter, such that said pulse width is at said second logic state continuously.

8. The signal generator of claim 2, wherein said pulse width can range from a value that is 0% of the cycle of said ripple counter to a value that is 100% of the cycle of said ripple counter, such that when the pulse width is 100% of the cycle of said ripple counter, it is continually in said second logic state.

9. The signal generator of claim 1, wherein said N-bit ripple counter is a down counter counting from a maximum value to a minimum value.

10. A method for generating a pulse width modulated signal to generate a pulse having a predetermined pulse width, comprising the steps of:
    generating a clock signal;
    clocking an N-bit ripple counter to provide on a count output with N clock outputs a non-synchronous count signal;
    receiving an N-bit enable word having a value corresponding to the predetermined pulse width, which enable word determines the pulse width as a predetermined number of clock cycles;
    processing the N enable bits of the enable word and the N clock outputs from the N-bit ripple counter through a combinatorial logic circuit to determine the number of clock cycles required to generate the predetermined pulse width and then generate a reset signal after the determined number of clock cycles has occurred; and
    initializing a pulse by changing an output from a first logic state to a second logic state and initiating the count operation in the combinatorial logic circuit to determine the number of clock cycles required to generate the predetermined pulse width and then changing from the second logic state to the first logic state on the output when the reset signal is generated, wherein the clock transitions on the N clock outputs are delayed from each other as a result of the inherent operation of the ripple counter with the transitions of the lower order N clock outputs occurring before any of the transitions of the higher order N clock outputs, such that no false transitions from the second logic state to the first logic state occur prior to the determined number of clock cycles having occurred from initiation of the pulse.

11. The method of claim 10, wherein the N-bit ripple counter continually rolls over at the end of the count operation associated therewith and wherein the step of initializing is operable to initiate the pulse at least once during each count cycle of the ripple counter.

12. The method of claim 11, wherein the step of initializing is operable to initiate the pulse at the time the ripple counter rolls over.

13. The method of claim 11, and further comprising the step of generating the enable word and incrementing the enable word at least once for different cycles of the counter.

14. The method of claim 13, wherein the step of generating the enable word is operable to continually increment the value of the enable word from a first value to a second value over different cycles of the ripple counter.

15. The method of claim 14, wherein the step of continually incrementing the value of the enable word comprises incrementing the enable word from a "0" value to a maximum value.

16. The method of claim 11, wherein the pulse width can range from a value of 0% of the cycle of the ripple counter to a value that is 100% of the cycle of the ripple counter, such that when the pulse width is 100% of the cycle of the ripple counter, it is continuously in the second logic state.

* * * * *